US012635470B2

(12) United States Patent
Lee et al.

(10) Patent No.: US 12,635,470 B2
(45) Date of Patent: May 19, 2026

(54) METHODS FOR MAKING SEMICONDUCTOR DEVICES

(71) Applicant: STATS ChipPAC Pte. Ltd., Singapore (SG)

(72) Inventors: GunHyuck Lee, Incheon (KR); Yujeong Jang, Incheon (KR)

( * ) Notice: Subject to any disclaimer, the term of this patent is extended or adjusted under 35 U.S.C. 154(b) by 414 days.

(21) Appl. No.: 18/317,093

(22) Filed: May 15, 2023

(65) Prior Publication Data

US 2023/0386888 A1     Nov. 30, 2023

(30) Foreign Application Priority Data

May 27, 2022    (CN) .......................... 202210593487.3

(51) Int. Cl.
  *H01L 21/683* (2006.01)
  *H01L 21/56* (2006.01)
  *H10D 89/00* (2025.01)

(52) U.S. Cl.
  CPC ........ *H01L 21/6836* (2013.01); *H01L 21/561* (2013.01); *H10D 89/015* (2025.01); *H01L 2221/68331* (2013.01); *H01L 2221/68381* (2013.01)

(58) Field of Classification Search
  CPC ............... H01L 21/6836; H01L 21/561; H01L 2221/68331; H01L 2221/68381; H01L 23/3121; H01L 2221/68368; H01L 23/552; H01L 21/568; H01L 21/78; H01L 23/3114; H01L 23/49816; H01L 24/96; H01L 2224/023; H01L 2924/15311; H01L 2924/15313; H10D 89/015

USPC ........................................................ 438/464
See application file for complete search history.

(56) References Cited

U.S. PATENT DOCUMENTS

| | | | | | |
|---|---|---|---|---|---|
| 7,187,060 | B2 * | 3/2007 | Usui | ....................... | H01L 24/97 |
| | | | | | 257/659 |
| 7,297,610 | B2 * | 11/2007 | Yang | ....................... | H01L 21/78 |
| | | | | | 438/455 |
| 7,678,667 | B2 * | 3/2010 | Foote | ................... | H01L 21/6836 |
| | | | | | 438/455 |
| 7,727,818 | B2 * | 6/2010 | Hsieh | ................... | H01L 23/5389 |
| | | | | | 257/E21.502 |

(Continued)

*Primary Examiner* — Vu A Vu
(74) *Attorney, Agent, or Firm* — Junhe Law Office, P.C.; Yi Zhang

(57) ABSTRACT

A method for making semiconductor devices includes: attaching a substrate with a plurality of electronic components onto a composite tape having an adhesive layer which is sensitive to ultraviolet (UV) irradiation and a UV-transparent base film, wherein the substrate is attached onto the adhesive layer of the composite tape; placing the substrate and the composite tape on a UV-transparent carrier, wherein the UV-transparent carrier is in contact with the UV-transparent base film of the composite tape; singulating the substrate into a plurality of semiconductor devices each having one of the plurality of electronic components; depositing a shielding material on the plurality of semiconductor devices to form a shielding layer on each of the plurality of semiconductor devices; irradiating a UV light to the composite tape through the UV-transparent carrier to reduce adhesivity of the adhesive layer; and detaching the plurality of semiconductor devices from the UV-transparent carrier.

13 Claims, 7 Drawing Sheets

(56)         References Cited

U.S. PATENT DOCUMENTS

| | | | | |
|---|---|---|---|---|
| 7,799,602 | B2 * | 9/2010 | Pagaila | H01L 23/552 |
| | | | | 257/E21.007 |
| 7,989,928 | B2 * | 8/2011 | Liao | H01L 23/49805 |
| | | | | 29/841 |
| 8,084,300 | B1 * | 12/2011 | San Antonio | H01L 23/552 |
| | | | | 438/114 |
| 8,268,677 | B1 * | 9/2012 | Pagaila | H01L 21/486 |
| | | | | 257/E21.502 |
| 8,368,185 | B2 * | 2/2013 | Lee | H01L 24/97 |
| | | | | 257/664 |
| 8,535,983 | B2 * | 9/2013 | Hin | H01L 21/568 |
| | | | | 257/E21.599 |
| 8,937,370 | B2 * | 1/2015 | Song | H01L 23/49822 |
| | | | | 257/659 |
| 9,236,356 | B2 * | 1/2016 | Yang | H01L 23/552 |
| 9,397,001 | B2 * | 7/2016 | Tanaka | H10D 30/6758 |
| 9,953,929 | B2 * | 4/2018 | Dias | H01L 21/565 |
| 10,037,949 | B1 | 7/2018 | Kim et al. | |
| 10,515,904 | B2 * | 12/2019 | Lin | H01L 23/49805 |
| 11,183,464 | B2 * | 11/2021 | Jang | H01L 21/78 |
| 2008/0315376 | A1 | 12/2008 | Tang | |
| 2020/0161252 | A1 | 5/2020 | Yang et al. | |

* cited by examiner

222

224

226

232

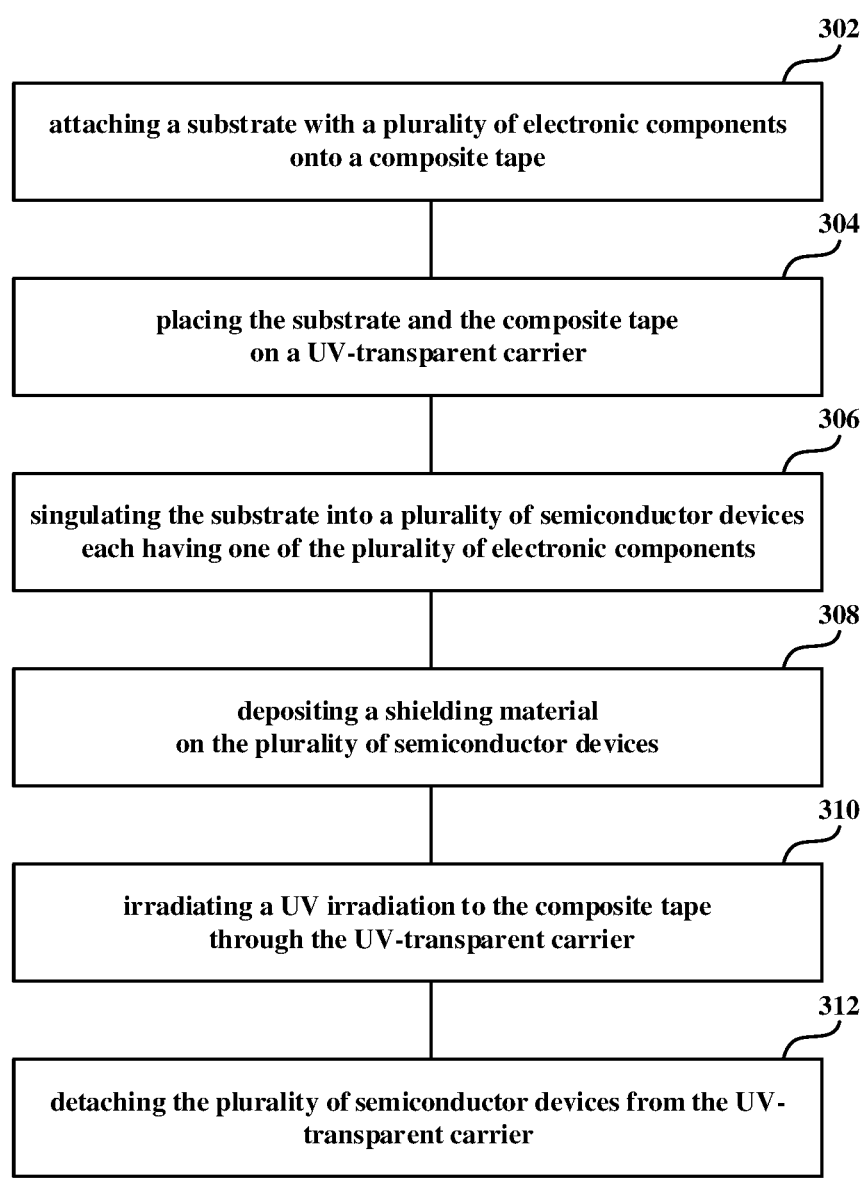

302 attaching a substrate with a plurality of electronic components
onto a composite tape

304 placing the substrate and the composite tape
on a UV-transparent carrier

306 singulating the substrate into a plurality of semiconductor devices
each having one of the plurality of electronic components

308 depositing a shielding material
on the plurality of semiconductor devices

310 irradiating a UV irradiation to the composite tape
through the UV-transparent carrier

312 detaching the plurality of semiconductor devices from the UV-
transparent carrier

Fig. 3

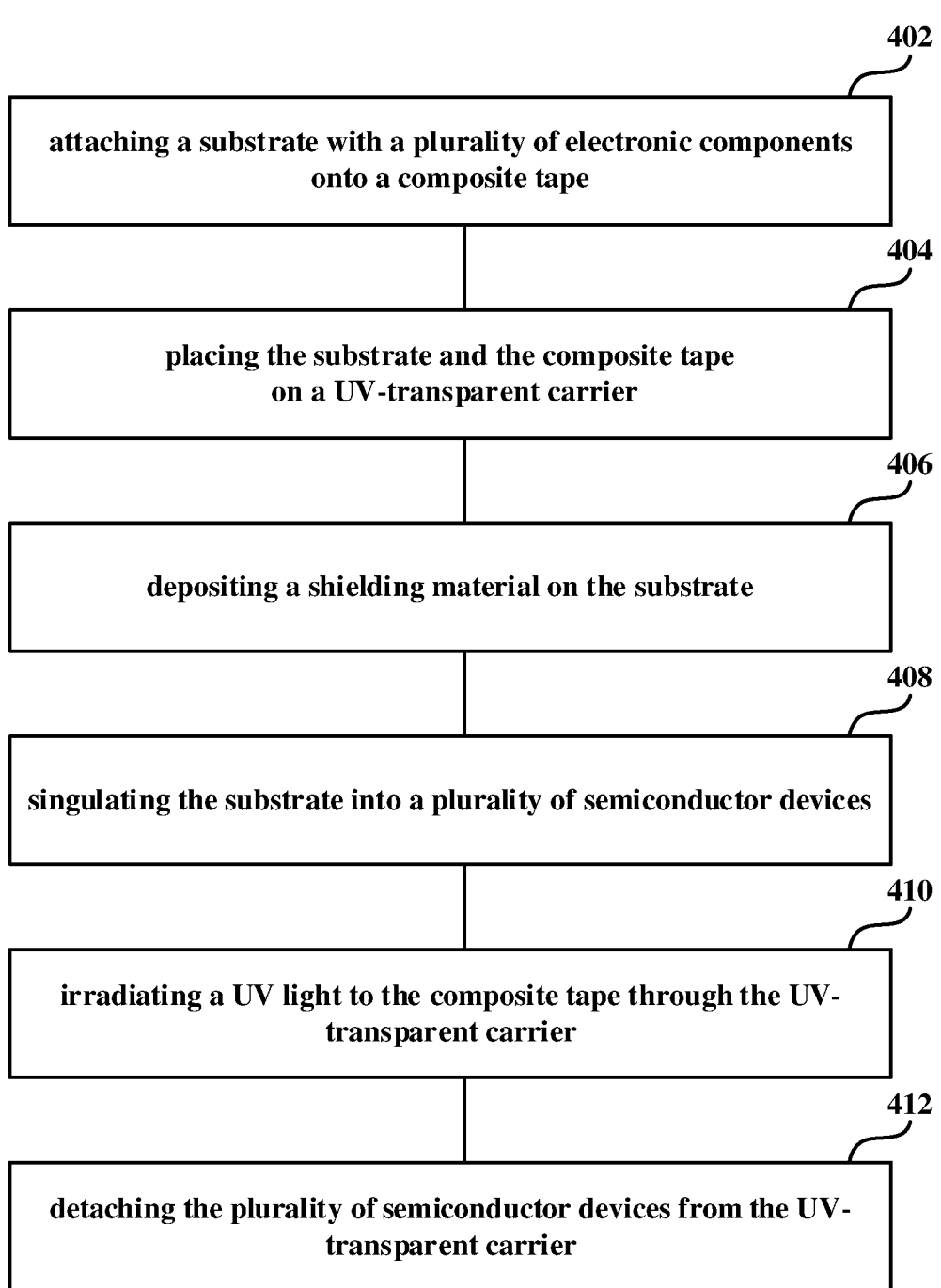

402 attaching a substrate with a plurality of electronic components
onto a composite tape

404 placing the substrate and the composite tape
on a UV-transparent carrier

406 depositing a shielding material on the substrate

408 singulating the substrate into a plurality of semiconductor devices

410 irradiating a UV light to the composite tape through the UV-
transparent carrier

412 detaching the plurality of semiconductor devices from the UV-
transparent carrier

Fig. 4

METHODS FOR MAKING SEMICONDUCTOR DEVICES

TECHNICAL FIELD

The present application generally relates to semiconductor technology, and more particularly, to methods for making semiconductor devices

BACKGROUND OF THE INVENTION

For electronic components in an electronic product, electromagnetic interference (EMI) shielding needs to be performed to prevent disruption by electromagnetic field, electrostatic field, etc. Typically, a semiconductor package may be provided with a metal cover or a uniformly spread coating around its outer periphery as a shielding layer. However, the current EMI shielding process can only form the shielding for semiconductor packages on a unit-by-unit basis, so that the productivity is relatively low.

Therefore, a need exists for an improved shielding process for semiconductor packages.

SUMMARY OF THE INVENTION

An objective of the present application is to provide a method for forming shielding for semiconductor devices with an improved productivity.

According to an aspect of the present application, a method for making semiconductor devices is provided. The method may include: attaching a substrate with a plurality of electronic components onto a composite tape having an adhesive layer which is sensitive to ultraviolet (UV) irradiation and a UV-transparent base film, wherein the substrate is attached onto the adhesive layer of the composite tape; placing the substrate and the composite tape on a UV-transparent carrier, wherein the UV-transparent carrier is in contact with the UV-transparent base film of the composite tape; singulating the substrate into a plurality of semiconductor devices each having one of the plurality of electronic components; depositing a shielding material on the plurality of semiconductor devices to form a shielding layer on each of the plurality of semiconductor devices; irradiating a UV light to the composite tape through the UV-transparent carrier to reduce adhesivity of the adhesive layer; and detaching the plurality of semiconductor devices from the UV-transparent carrier.

According to another aspect of the present application, a method for making semiconductor devices is provided. The method may include: attaching a substrate with a plurality of electronic components onto a composite tape having an adhesive layer which is sensitive to ultraviolet (UV) irradiation and a UV-transparent base film, wherein the substrate is attached onto the adhesive layer of the composite tape; placing the substrate and the composite tape on a UV-transparent carrier, wherein the UV-transparent carrier is in contact with the UV-transparent base film of the composite tape; depositing a shielding material on the substrate; singulating the substrate into a plurality of semiconductor devices each having one of the plurality of electronic components; irradiating a UV light to the composite tape through the UV-transparent carrier to reduce adhesivity of the adhesive layer; and detaching the plurality of semiconductor devices from the UV-transparent carrier.

It is to be understood that both the foregoing general description and the following detailed description are exemplary and explanatory only, and are not restrictive of the invention. Further, the accompanying drawings, which are incorporated in and constitute a part of this specification, illustrate embodiments of the invention and together with the description, serve to explain principles of the invention.

BRIEF DESCRIPTION OF DRAWINGS

The drawings referenced herein form a part of the specification. Features shown in the drawing illustrate only some embodiments of the application, and not of all embodiments of the application, unless the detailed description explicitly indicates otherwise, and readers of the specification should not make implications to the contrary.

FIG. 3 is a flowchart illustrating a method for making semiconductor devices according to an embodiment of the present application.

FIG. 4 is a flowchart illustrating a method for making semiconductor devices according to another embodiment of the present application.

The same reference numbers will be used throughout the drawings to refer to the same or like parts.

DETAILED DESCRIPTION OF THE INVENTION

Figure 1A:
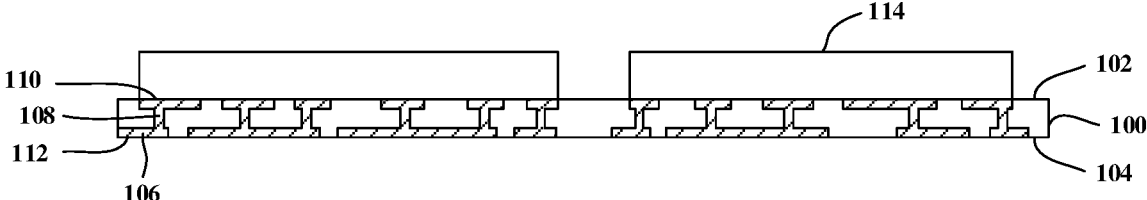
FIGS. 1A-1I illustrate cross-sectional views of a process for making semiconductor devices according to an embodiment of the present application.

The following detailed description of exemplary embodiments of the application refers to the accompanying drawings that form a part of the description. The drawings illustrate specific exemplary embodiments in which the application may be practiced. The detailed description, including the drawings, describes these embodiments in sufficient detail to enable those skilled in the art to practice the application. Those skilled in the art may further utilize other embodiments of the application, and make logical, mechanical, and other changes without departing from the spirit or scope of the application. Readers of the following detailed description should, therefore, not interpret the description in a limiting sense, and only the appended claims define the scope of the embodiment of the application.

In this application, the use of the singular includes the plural unless specifically stated otherwise. In this application, the use of "or" means "and/or" unless stated otherwise. Furthermore, the use of the term "including" as well as other forms such as "includes" and "included" is not limiting. In addition, terms such as "element" or "component" encompass both elements and components including one unit, and elements and components that include more than one subunit, unless specifically stated otherwise. Additionally, the section headings used herein are for organizational purposes only, and are not to be construed as limiting the subject matter described.

As used herein, spatially relative terms, such as "beneath", "below", "above", "over", "on", "upper", "lower", "left", "right", "vertical", "horizontal", "side" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly. It should be understood that when an element is referred to as being "connected to" or "coupled to" another element, it may be directly connected to or coupled to the other element, or intervening elements may be present.

FIGS. 1A-1I illustrate cross-sectional views of a process for making semiconductor devices according to an embodiment of the present application. The process can be performed on a substrate with various electronic components such as semiconductor dice or semiconductor packages mounted on the substrate, so as to form a shielding layer for each of the electronic components. The shielding layer can be made of a conductive material such as copper, aluminum, iron, or any other suitable material for electromagnetic interference (EMI) shielding. The EMI shielding layer may shield EMI induced to or generated by the electronic component.

As shown in FIG. 1A, a substrate 100 is provided. The substrate 100 has a top surface 102 and a bottom surface 104 which is opposite to the top surface 102. In some embodiments, the substrate 100 can be a printed circuit board or another suitable substrate that may require further singulation process. The substrate 100 may include one or more insulating or passivation layers and one or more interconnection structures 106 formed in the insulating or passivation layers. Each interconnection structure 106 may include one or more conductive vias 108 formed through the insulating layers, and one or more conductive layers 110 and 112 formed on the top surface 102 and the bottom surface 104, respectively. The substrate 100 may include one or more laminated layers of polytetrafluoroethylene pre-impregnated, FR-4, FR-1, CEM-1, or CEM-3 with a combination of phenolic cotton paper, epoxy, resin, woven glass, matte glass, polyester, and other reinforcement fibers or fabrics. The substrate 100 can also be a multi-layer flexible laminate, ceramic, copper clad laminate, or glass. The electrically conductive layers or redistribution layers (RDL) inside the substrate 100 can be formed using sputtering, electrolytic plating, electroless plating, or other suitable deposition process. The conductive layers may be one or more layers of Al, Cu, Sn, Ni, Au, Ag, titanium (Ti), tungsten (W), or other suitable electrically conductive material.

A plurality of electronic components 114 are mounted onto the top surface 102 of the substrate 100. The electronic components 114 can be electrically connected to the interconnection structures 106, respectively. In some embodiments, the electronic component 114 may include a semiconductor die or a semiconductor package. For example, semiconductor dice can be formed in a flip chip type and may be mounted onto the top surface 102 such that conductive bumps of the semiconductor dice can be welded to some of the interconnection structures 106 of the substrate 100. In other embodiments, semiconductor dice may include bond pads and may be connected to the interconnection structure 106 by wire bonding. In the embodiment shown in FIG. 1A, the substrate 100 includes land grid array (LGA) contacts on the bottom surface 104, however, in some other embodiments, the substrate may include another type of conductive patterns or structures such as ball grid array (BGA) bumps on the bottom surface 104.

Figure 1B:
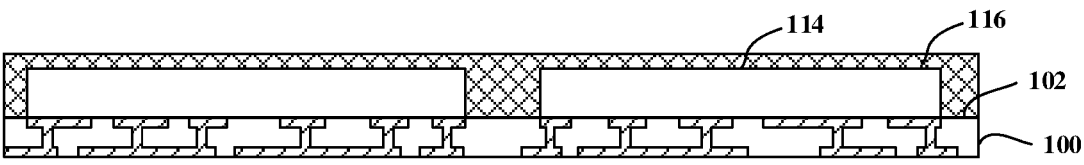

As shown in FIG. 1B, an encapsulant layer 116 may be formed on the substrate 100, which covers the electronic components 114 and the top surface 102. The encapsulant layer 116 may be made of a general molding compound resin, for example, an epoxy-based resin, but the scope of this application is not limited thereto. The encapsulant layer 116 can protect the electronic components 114 from external circumstances. In some embodiments, a grinding operation can be performed on the encapsulant layer 116 to reduce a thickness of the encapsulant layer 116 and, optionally, to expose the electronic components 114.

Figure 1C:
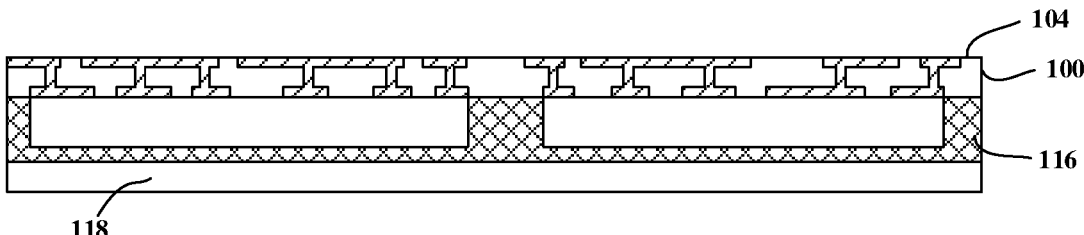

As shown in FIG. 1C, the substrate 100 is placed onto a first carrier 118, with its bottom surface 104 facing upward and the encapsulant layer 116 being in contact with the first carrier 118. The first carrier 118 serves as a transfer carrier that enables the inversion of the substrate 100 and facilitates further processing on the bottom surface 104 of the substrate 100, as elaborated below.

Figure 1D:
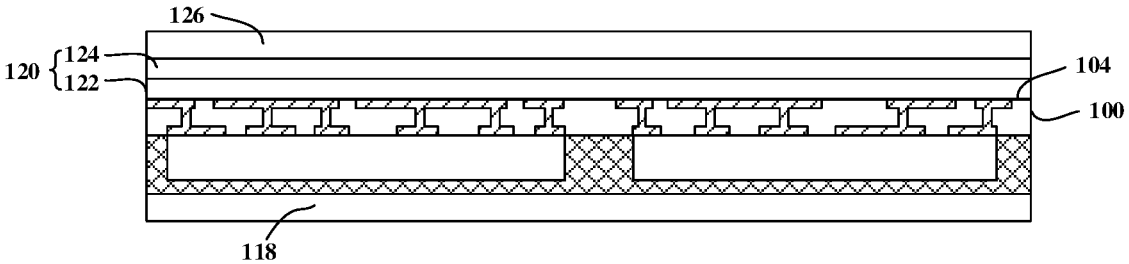

As shown in FIG. 1D, a composite tape 120 is attached onto the bottom surface 104 of the substrate 100. The composite tape 120 includes an adhesive layer 122, which can be adhered to the bottom surface 104. The adhesive layer 122 is sensitive to ultraviolet (UV) irradiation, such that, upon irradiation by a UV light beam, certain characteristics of the adhesive layer 122 may change, for example, the adhesivity of the adhesive layer 122 may be decreased. The composite tape 120 further includes a base film 124 that is laminated with the adhesive layer 122. The base film 124 is UV-transparent so that UV light beam can pass through the base film 124 and into adhesive layer 122, when a UV light source (not shown) emits UV light beams from the base film side of the composite tape 120. In some embodiments, the base film 124 is a polyimide film, or any other suitable films that is UV-transparent. It is noted that although the composite tape 120 shown in FIG. 1D includes two layers 122 and 124, more layers can be included in the composite tape according to some other embodiments of the present application. For example, one or more intermediate layers may be disposed between the adhesive layer 122 and the base film 124, which is UV-transparent as well. For another example, a second UV-transparent adhesive layer may be disposed on the other side of the base film, which helps the attachment of the composite tape to the second carrier. Preferably, a second UV-transparent adhesive layer may also be UV-sensitive. In this way, the adhesivity of the second UV-transparent adhesive layer may be decreased by UV irradiation to facilitate the detachment of the composite tape from the second carrier in a later stage as elaborated below.

Still referring to FIG. 1D, a second carrier 126 is attached to the substrate 100. In particular, the second carrier 126 can be disposed upside of the substrate 100 and is thus in contact with the base film 124. In this way, the substrate 100 can be held between the first and second carriers 118 and 126. The second carrier 126 is a UV-transparent carrier that allows UV light to pass therethrough. Since both the second carrier 126 and the base film 124 are UV transparent, UV light emitted from an external UV light source can pass through them into the UV-sensitive adhesive layer 122. In some embodiments, the UV-transparent second carrier 126 includes a sapphire carrier or a glass carrier. Afterwards, as shown in FIG. 1E, the first carrier 118, the second carrier 126 and the substrate 100 held therebetween can be inversed and then the first carrier 118 can be released off the substrate 100, leaving the substrate 100 placed on the second carrier 126.

Figure 1E:
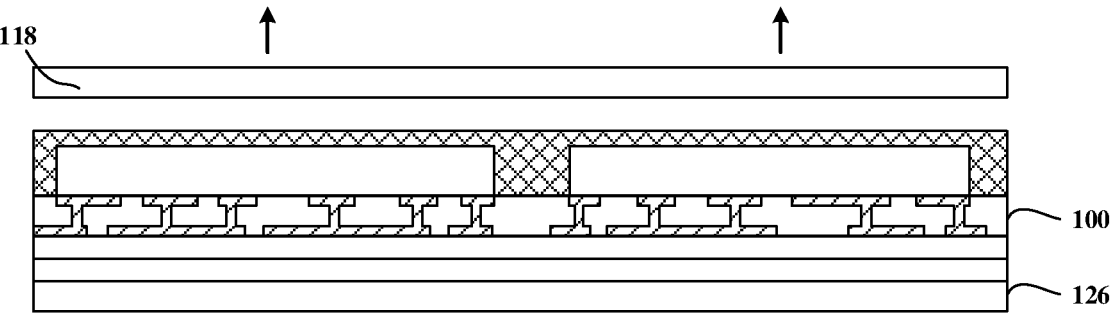

It is noted that although in the steps shown in FIGS. 1C to 1E, two carriers, i.e., the first carrier 118 and the second carrier 126, are used to hold the substrate 100 and attach the composite tape 120 onto the substrate 100, a single carrier can be used to implement the same or similar purpose. For example, after the step of forming the encapsulant layer on the substrate as shown in FIG. 1B, the substrate can be placed onto the second carrier mounted with the composite tape. Accordingly, the composite tape can be disposed between the substrate and the second carrier, with the adhesive layer facing upward and being in contact with the substrate 100, and the base film facing downward and being in contact with the second carrier 126.

Figure 1F:
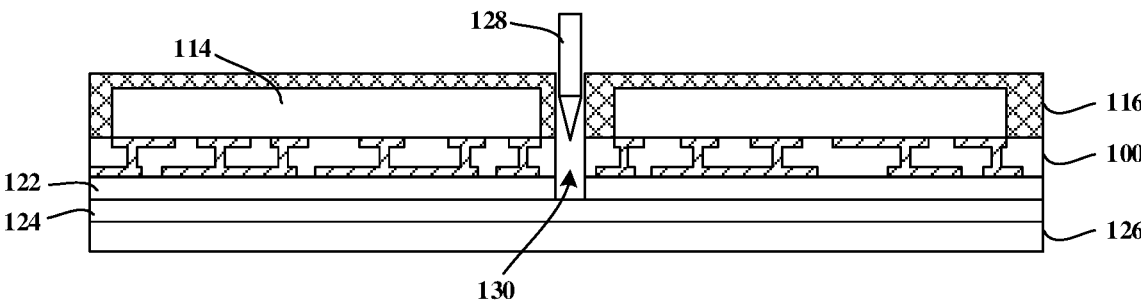

As shown in FIG. 1F, after the first carrier is released, the substrate 100 can be singulated, for example, using a cutting saw or blade 128, to separate the electronic components 114 from each other. Each electronic component 114, the portion of substrate 100 under the electronic component 114, and the encapsulant layer 116 covering the electronic component 114 form a semiconductor device. For example, the cutting saw or blade 128 can cut the regions of the encapsulant layer 116 under which no electronic component is mounted. In this way, a trench 130 may be formed in the substrate 100 and the encapsulant layer 116 between each two adjacent electronic components 114. The trench 130 extends through both of the substrate 100 and the adhesive layer 122. In some embodiments, the trench 130 may not extend into the base film 124, as shown in FIG. 1F; and in some other embodiments, the trench 130 may extend into the base film 124 but not into the second carrier 126. It can be seen that the base film 124 serves as a protection film for the second carrier 126, thereby preventing undesired damages to the second carrier 126 during the singulation process and allowing reuse of the second carrier 126 in further batches. In some embodiments, the trench 130 has a depth-width ratio smaller than 20:1, or preferably smaller than 10:1.

Figure 1G:
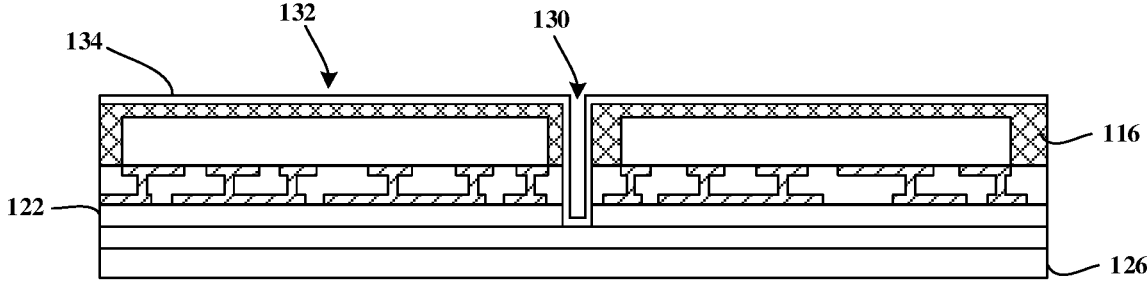

After the singulation process, as shown in FIG. 1G, a shielding material may be deposited on the separated semiconductor devices 132, such that a shielding layer 134 is formed on each of the semiconductor devices 132. In particular, the shielding material may be further deposited into the trench 130 between each two adjacent semiconductor devices 132. In this way, both top surfaces and sides walls of the semiconductor devices 132 can be covered with the shielding layer 134. In some embodiments, the shielding material may be formed by spray coating, plating, sputtering, or any other suitable metal deposition process. The shielding material may be formed from copper, aluminum, iron, or any other suitable material for EMI shielding.

Figure 1H:
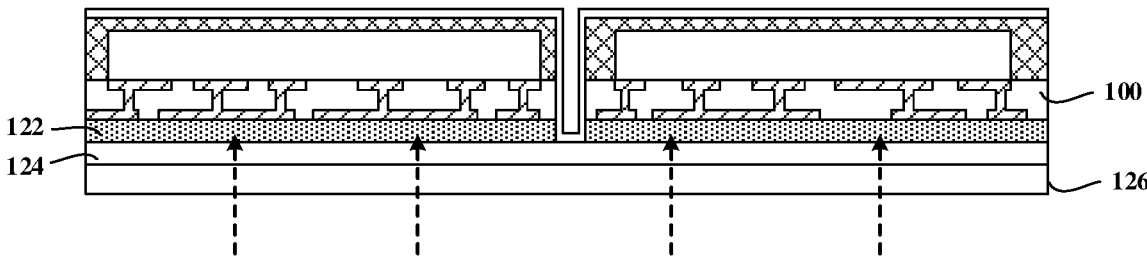

As shown in FIG. 1H, a UV light such as a UV laser beam may be emitted from a light source under the second carrier 126. As aforementioned, since both the second carrier 126 and the base film 124 are UV transparent, the UV light can pass through the second carrier 126 and the base film 124 into the UV-sensitive adhesive layer 122. The irradiation by the UV light to the adhesive layer 122 changes the characteristics of the adhesive layer 122, including decreasing the adhesivity of the adhesive layer 122. In some embodiments, the irradiation can be performed on a row-by-row or column-by-column basis, which improves the efficiency of the irradiation process compared with conventional unit-by-unit processes. In some preferred embodiment, the irradiation can be performed on a plane-by-plane basis, which further improves the productivity.

Figure 1I:
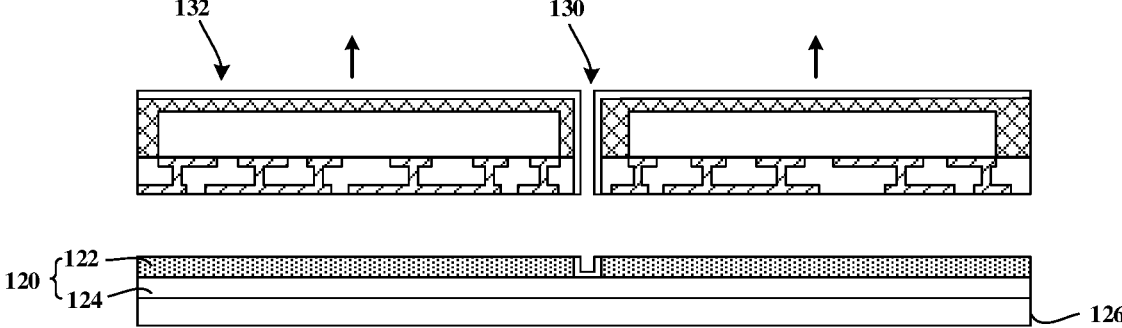

Afterwards, as shown in FIG. 1I, a physical force can be exerted onto each of the semiconductor devices 132 to separate them from the second carrier 126. Since the adhesivity of the adhesive layer 122 is decreased due to prior UV irradiation, it is easier to detach the semiconductor device 132 from the second carrier 126. Moreover, since the trenches 130 between adjacent semiconductor devices 132 extend deep enough into the adhesive layer 122, the shielding layer 134 may clearly crack at the bottom of the side walls of the semiconductor devices 132, without forming undesired metal burrs that may deteriorate the performance of the semiconductor devices and cause quality issues such as short circuit problem.

Still referring to FIG. 1I, after the removal of the semiconductor devices 132, the composite tape 120 remains on the second carrier 126. Accordingly, the composite tape 120 can be further detached from the second carrier 126, such that the second carrier 126 can be reused to make another batch of the semiconductor devices. In other words, the entire process is sustainable by recycling the second carrier, thereby the cost for manufacturing can be reduced. As aforementioned, in some embodiments, a second UV-transparent adhesive layer may be disposed on the other side of the base film, and preferably, the second UV-transparent adhesive layer may also be UV-sensitive. As such, upon the adhesivity of the second UV-transparent adhesive layer may be decreased by UV irradiation and it may be easier to detach the composite tape from the second carrier.

The above embodiment as shown in FIGS. 1A to 1I describes a process for making semiconductor devices which may have a shielding layer on both top surfaces and side walls. In some other embodiments, it may not be needed to form the shielding layer on the side walls. FIGS. 2A to 2E illustrate cross-sectional views of another process for making semiconductor devices according to an embodiment of the present application. The process can be used to make semiconductor devices without side wall shielding layers. It is noted that certain steps of the process may be the same as or similar to certain steps of the process shown in FIGS. 1A to 1I and thus will not be elaborated herein.

Figure 2A:
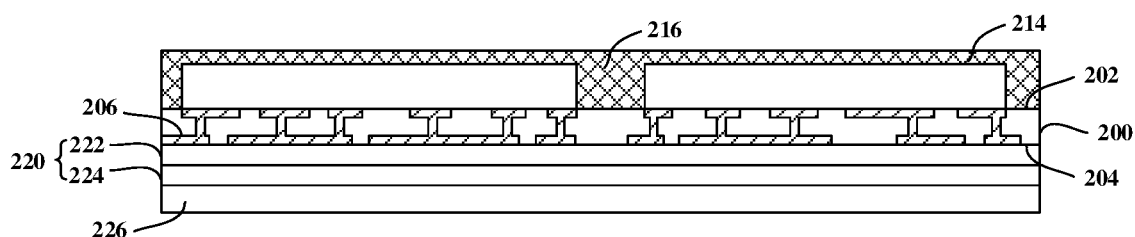
FIGS. 2A-2E illustrate cross-sectional views of another process for making semiconductor devices according to an embodiment of the present application.

As shown in FIG. 2A, a substrate 200 is provided. The substrate 200 has a top surface 202 and a bottom surface 204 which is opposite to the top surface 202. The substrate 200 may include one or more insulating or passivation layers and one or more interconnection structures 206 formed in the insulating or passivation layers. A plurality of electronic components 214 are mounted onto the top surface 202 of the substrate 200. The electronic components 214 can be electrically connected to the interconnection structures 206, respectively. In some embodiments, the electronic component 214 may include a semiconductor die or a semiconductor package. An encapsulant layer 216 may be formed on the substrate 200, which covers the electronic components 214 and the top surface 202. The encapsulant layer 216 may be made of a general molding compound resin such as an epoxy-based resin.

The substrate 200 is placed on a UV-transparent carrier 226 using a composite tape 220. In particular, the composite tape 220 includes an adhesive layer 222 and a base film 224 which are laminated with each other. The adhesive layer 222 is adhered to the bottom surface 204 of the substrate 200, and the base film 224 is attached to the UV-transparent carrier 226. The adhesive layer 222 is sensitive to UV irradiation, such that, upon irradiation by a UV light beam, certain characteristics of the adhesive layer 222 may change, for example, the adhesivity of the adhesive layer 222 may be decreased. The base film 224 is UV-transparent so that the UV light beam can pass through the base film 224 and into adhesive layer 222, when a UV light source (not shown) emits UV light beams from the base film side of the composite tape 220. The structures and materials of the substrate 200, the composite tape 220 and the carrier 226 are similar to those described with reference to FIGS. 1A to 1I.

Figure 2B:
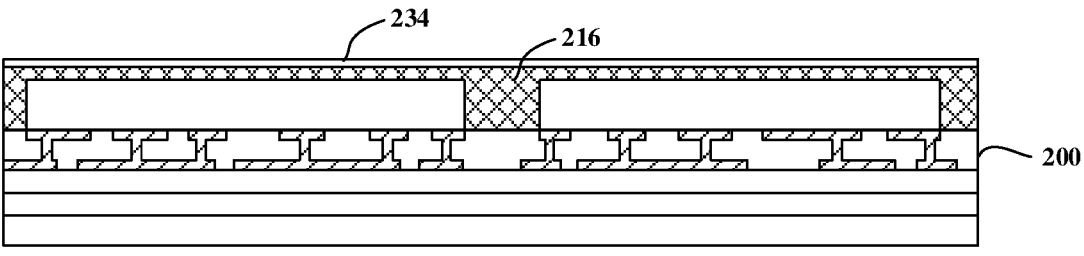

As shown in FIG. 2B, a shielding material may be deposited on the substrate 200 such that a shielding layer 234 is formed on the substrate 200, or particularly, on the encapsulant layer 216. In some embodiments, the shielding material may be formed by spray coating, plating, sputtering, or any other suitable metal deposition process. The shielding material may be formed from copper, aluminum, iron, or any other suitable material for EMI shielding.

Figure 2C:
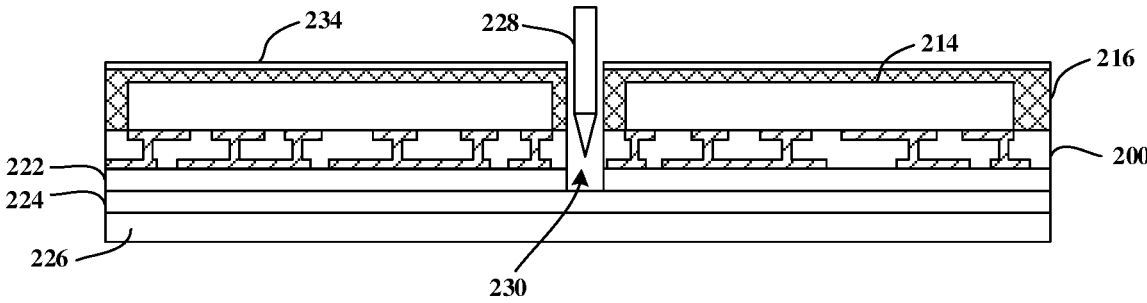

Afterwards, as shown in FIG. 2C, the substrate 200 can be singulated, for example, using a cutting saw or blade 228, to separate the electronic components 214 from each other. Each electronic component 214, the portion of substrate 200 under the electronic component 214, and the encapsulant layer 216 and shielding layer 234 covering the electronic component 214 form a semiconductor device. As such, a trench 230 may be formed in the substrate 200 and the encapsulant layer 216 between each two adjacent electronic components 214. The trench 230 extends through the substrate 200 and the adhesive layer 222. In some embodiments, the trench 230 may not extend into the base film 224, as shown in FIG. 2C; and in some other embodiments, the trench 230 may extend into the base film 224 but not into carrier 226. It can be seen that the base film 224 serves as a protection film for the carrier 226, thereby preventing undesired damages to the carrier 226 during the singulation process. Moreover, since the singulation process is performed after the shielding deposition process, there is no shielding layer formed on the side walls of the semiconductor devices, or at least no shielding layer in the trenches 230.

Figure 2D:
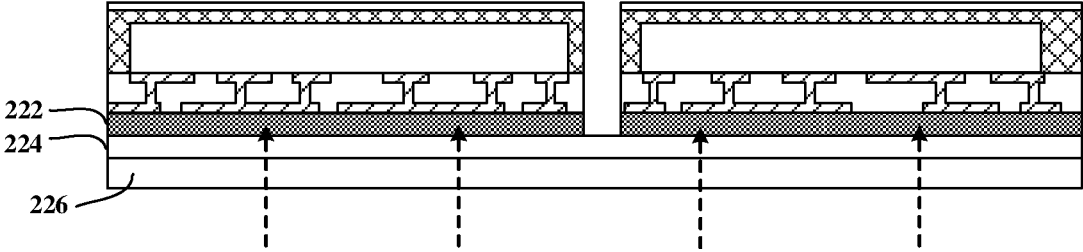
Figure 2E:
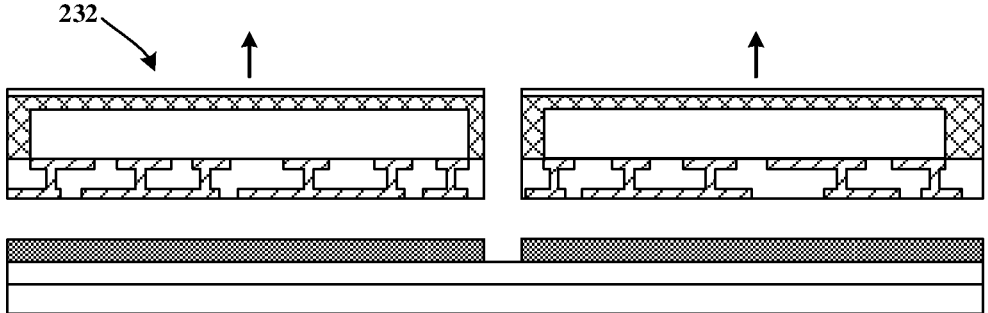

As shown in FIG. 2D, a UV light such as a UV laser beam may be emitted from a light source under the carrier 226. The UV light can pass through the UV-transparent carrier 226 and the UV-transparent base film 224 into the UV-sensitive adhesive layer 222, thereby changing the characteristics of the adhesive layer 222, including decreasing the adhesivity of the adhesive layer 222. Afterwards, as shown in FIG. 2E, a physical force can be exerted onto each of the separated semiconductor devices 232 to separate them from the carrier 226. Since the adhesivity of the adhesive layer 222 is decreased, it is easier to detach the semiconductor device 232 from the carrier 226. Moreover, since the shielding layer 234 is separated into various pieces during the singulation process, no burrs may be formed in the separated semiconductor devices. In this way, quality issues such as short circuit problem due to metal burrs may be avoided.

FIG. 3 is a flowchart illustrating a method for making semiconductor devices according to an embodiment of the present application. Details of the method can be referred to the embodiment shown in FIGS. 1A to 1I.

As shown in FIG. 3, in step 302, a substrate with a plurality of electronic components is attached onto a composite tape. The composite tape has an adhesive layer which is sensitive to ultraviolet (UV) irradiation and a UV-transparent base film, and the substrate is attached onto the adhesive layer of the composite tape. In step 304, the substrate and the composite tape are placed on a UV-transparent carrier, and the UV-transparent carrier is in contact with the UV-transparent base film of the composite tape. In step 306, the substrate is singulated into a plurality of semiconductor devices each having one of the plurality of electronic components. In step 308, a shielding material is deposited on the plurality of semiconductor devices to form a shielding layer on each of the plurality of semiconductor devices. In step 310, UV light is irradiated to the composite tape through the UV-transparent carrier to reduce adhesivity of the adhesive layer. In step 312, the plurality of semiconductor devices are detached from the UV-transparent carrier.

FIG. 4 is a flowchart illustrating a method for making semiconductor devices according to another embodiment of the present application. Details of the method can be referred to the embodiment shown in FIGS. 2A to 2E.

As shown in FIG. 4, in step 402, a substrate with a plurality of electronic components is attached onto a composite tape having an adhesive layer which is sensitive to ultraviolet (UV) irradiation and a UV-transparent base film. The substrate is attached onto the adhesive layer of the composite tape. In step 404, the substrate and the composite tape are placed on a UV-transparent carrier, and the UV-transparent carrier is in contact with the UV-transparent base film of the composite tape. In step 406, a shielding material is deposited on the substrate. In step 408, the substrate is singulated into a plurality of semiconductor devices each having one of the plurality of electronic components. In step 410, a UV light is irradiated to the composite tape through the UV-transparent carrier to reduce adhesivity of the adhesive layer. In step 412, the plurality of semiconductor devices are detached from the UV-transparent carrier.

The discussion herein included numerous illustrative figures that showed various steps in a method of making semiconductor devices. For illustrative clarity, such figures did not show all aspects of each example assembly. Any of the example assemblies and/or methods provided herein may share any or all characteristics with any or all other assemblies and/or methods provided herein.

Various embodiments have been described herein with reference to the accompanying drawings. It will, however, be evident that various modifications and changes may be made thereto, and additional embodiments may be implemented, without departing from the broader scope of the invention as set forth in the claims that follow. Further, other embodiments will be apparent to those skilled in the art from consideration of the specification and practice of one or more embodiments of the invention disclosed herein. It is intended, therefore, that this application and the examples herein be considered as exemplary only, with a true scope and spirit of the invention being indicated by the following listing of exemplary claims.

The invention claimed is:

1. A method for making semiconductor devices, comprising:

attaching a substrate with a plurality of electronic components onto a composite tape having an adhesive layer which is sensitive to ultraviolet (UV) irradiation and a UV-transparent base film, wherein the substrate is attached onto the adhesive layer of the composite tape;

placing the substrate and the composite tape on a UV-transparent carrier, wherein the UV-transparent carrier is in contact with the UV-transparent base film of the composite tape;

singulating the substrate into a plurality of semiconductor devices each having one of the plurality of electronic components, including:

forming between each two adjacent electronic components a trench that extends through the substrate and at least into the adhesive layer of the composite tape without exposing the UV-transparent carrier;

depositing a shielding material on the plurality of semiconductor devices to form a shielding layer on each of the plurality of semiconductor devices;

irradiating a UV irradiation to the composite tape through the UV-transparent carrier to reduce adhesivity of the adhesive layer; and detaching the plurality of semiconductor devices from the UV-transparent carrier.

2. The method of claim 1, wherein the trenches do not extend through the UV-transparent base film.

3. The method of claim 1, wherein the substrate comprises one or more electrically conductive layers or redistribution layers.

4. The method of claim 1, wherein the electronic components comprise one or more semiconductor dice or semiconductor packages.

5. The method of claim 1, wherein the UV-transparent base film comprises a polyimide film.

6. The method of claim 1, wherein the UV-transparent carrier comprises a sapphire carrier or a glass carrier.

7. The method of claim 1, wherein the substrate comprises land grid array (LGA) contacts or ball grid array (BGA) bumps.

8. A method for making semiconductor devices, comprising:

attaching a substrate with a plurality of electronic components onto a composite tape having an adhesive layer which is sensitive to ultraviolet (UV) irradiation and a UV-transparent base film, wherein the substrate is attached onto the adhesive layer of the composite tape;

placing the substrate and the composite tape on a UV-transparent carrier, wherein the UV-transparent carrier is in contact with the UV-transparent base film of the composite tape;

depositing a shielding material on the substrate;

singulating the substrate into a plurality of semiconductor devices each having one of the plurality of electronic components, including:

forming between each two adjacent electronic components a trench that extends through the substrate and at least into the adhesive layer of the composite tape without exposing the UV-transparent carrier;

irradiating a UV light to the composite tape through the UV-transparent carrier to reduce adhesivity of the adhesive layer; and detaching the plurality of semiconductor devices from the UV-transparent carrier.

9. The method of claim 8, wherein the substrate comprises one or more electrically conductive layers or redistribution layers.

10. The method of claim 8, wherein the electronic components comprise one or more semiconductor dice or semiconductor packages.

11. The method of claim 8, wherein the UV-transparent film comprises a polyimide film.

12. The method of claim 8, wherein the UV-transparent carrier comprises a sapphire carrier or a glass carrier.

13. The method of claim 8, wherein the substrate comprises land grid array (LGA) contacts or ball grid array (BGA) bumps.

\* \* \* \* \*